United States Patent
Maheshwari

(10) Patent No.: US 8,122,189 B1
(45) Date of Patent: Feb. 21, 2012

(54) METHODS FOR LOGICALLY COMBINING RANGE REPRESENTATION VALUES IN A CONTENT ADDRESSABLE MEMORY

(75) Inventor: Dinesh Maheshwari, Fremont, CA (US)

(73) Assignee: Netlogic Microsystems, Inc., Santa Clara, CA (US)

( * ) Notice: Subject to any disclaimer, the term of this patent is extended or adjusted under 35 U.S.C. 154(b) by 0 days.

(21) Appl. No.: 12/901,859

(22) Filed: Oct. 11, 2010

Related U.S. Application Data

(63) Continuation of application No. 11/219,109, filed on Sep. 1, 2005, now Pat. No. 7,814,266.

(51) Int. Cl.
*G06F 13/00* (2006.01)
(52) U.S. Cl. ............ 711/108; 711/109; 711/110; 714/54
(58) Field of Classification Search .................. 711/108, 711/109, 110; 714/54
See application file for complete search history.

(56) References Cited

U.S. PATENT DOCUMENTS

| 6,987,683 | B2 * | 1/2006 | Ao | 365/49.18 |
| 2002/0080638 | A1 * | 6/2002 | Hata | 365/49 |

OTHER PUBLICATIONS

U.S. Appl. No. 11/219,109, filed Sep. 1, 2005, parent application to the present continuation application.

* cited by examiner

*Primary Examiner* — Yong Choe
(74) *Attorney, Agent, or Firm* — Haverstock & Owens, LLP

(57) ABSTRACT

A method may include comparing a first content addressable memory ("CAM") entry with a first key value to generate a first comparison result; comparing each of multiple second CAM entries with a second key value to generate multiple second comparison results; and generating a match signal if the first key value matches the first CAM entry and the second key value matches at least one of the multiple second CAM entries.

20 Claims, 6 Drawing Sheets

| RULE # | RULE DESCRIPTION |
|---|---|
| 1 | DENY ALL TRAFFIC FROM SOURCE IP ADDRESSES 66.77.* |
| 2 | ALLOW ONLY HTTP REQUESTS (TCP DEST. PORT 80) TO DESTINATION IP ADDRESSES 15.24.* |
| 3 | DENY UDP PACKETS TO DESTINATION PORTS LESS THAN OR EQUAL TO 255 |

FIG. 2

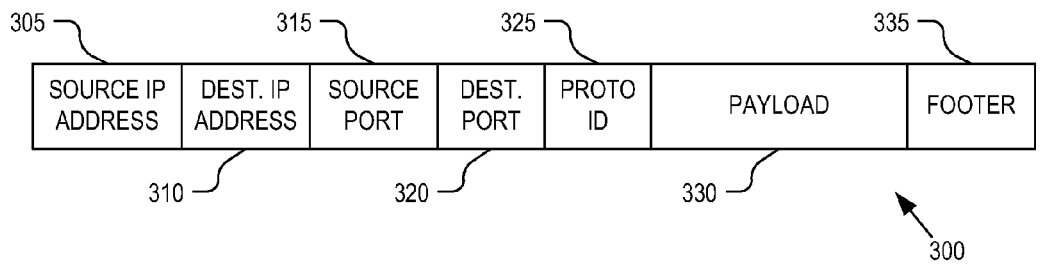

FIG. 3

| RULE # | | SOURCE IP ADDRESS | DEST. IP ADDRESS | SOURCE PORT | DEST. PORT | PROTO ID | ACTION |
|---|---|---|---|---|---|---|---|
| 1 | | 66.77.XX.XX | XX.XX.XX.XX | XXXX | XXXX | XX | DENY |
| | | FF.FF.00.00 | 00.00.00.00 | 0000 | 0000 | 00 | |
| 2 | | XX.XX.XX.XX | 15.24.XX.XX | XXXX | 0050 | 06 | ALLOW |
| | | 00.00.00.00 | FF.FF.00.00 | 0000 | FFFF | FF | |
| 3 | | XX.XX.XX.XX | XX.XX.XX.XX | XXXX | 00XX | 11 | DENY |
| | | 00.00.00.00 | 00.00.00.00 | 0000 | FF00 | FF | |

FIG. 4

METHODS FOR LOGICALLY COMBINING RANGE REPRESENTATION VALUES IN A CONTENT ADDRESSABLE MEMORY

This application is a continuation of U.S. patent application Ser. No. 11/219,109 filed on Sep. 1, 2005, the contents of which are incorporated by reference herein.

TECHNICAL FIELD

This disclosure relates generally to content addressable memory ("CAM"), and in particular but not exclusively, relates to range matching using CAM.

BACKGROUND INFORMATION

As information network systems continue to proliferate, network processing applications and hardware for processing packets quickly and efficiently are increasingly important. Network switches and/or routers receive packets, extract information from the packet header/footers, and process the packets according to the extracted information. Network header information can establish, to name just a few possible examples, the destination of a packet and/or the manner in which a packet should be transmitted.

Packet routing and/or switching may use a matching function. In a matching function, a header field (or other packet field) is compared against a number of stored rules. In the event the field (or a portion of the field) matches a stored rule, a match indication is generated. The match indication can be used to take appropriate action on the packet.

One device that is particularly suitable for implementing matching functions is content addressable memory ("CAM"), also referred to as "associative memory." FIG. 1 illustrates a conventional CAM array 100. CAM array 100 includes a key register 105 to store a key entry, a plurality of CAM cells 110 each to store a CAM entry W0-WN (also referred to as rule entries), and a priority encoder 115. CAM cells 110 are addressed according to the contents (i.e., CAM entries W0-WN) that they store. In a typical CAM matching function, a key (which can be a header field or a portion thereof) is loaded into key register 105 as the key entry. The key entry is then compared to each of the CAM entries W0-WN stored within CAM cells 110. In the event the key entry matches one of the CAM entries, a match signal for the matching CAM cell 110 is generated. In the event there is more than one match, the highest priority match(es) may be selected according to predetermined priority criteria implemented by priority encoder 115. Priority encoder 115 then outputs a match address identifying which CAM entry was a "hit" or matches with the key entry.

CAM array 100 typically comes in two flavors a "binary" CAM array and a "ternary" CAM ("TCAM") array. In a binary CAM array, the multi-bit key entry must exactly match every bit of a CAM entry to generate a hit. In a TCAM array, the multi-bit key entry can be compared with "maskable" bits of the CAM entries. Only the non-masked bits of the CAM entries must exactly match to generate a hit. Therefore, a masked bit of a CAM entry will not generate a mismatch indication even if the masked bit value is different than the corresponding bit value of the key entry.

Cam array 100 is well suited for use with network search engines, access control lists ("ACLs"), and other high density, high speed matching functions. One type of match function is a match against range rule ("MARR"). With MARR multiple CAM entries are stored to represent a single range rule (e.g., $x<47$, $5<x<25$, $x=5, 6,$ or $7,$ etc.). If the key entry happens to fall within a range stored with CAM cells 110, one or more of CAM cells 110 will generate a hit. When implementing MARR with a large number of rules or with large ranges, the number of CAM cells 110 can be extremely large. The more CAM cells 110 needed, the larger the semiconductor real estate occupied and the greater the power consumed.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

FIG. 2 is a table illustrating range rule descriptions for use with an access control list, in accordance with an embodiment of the invention.

FIG. 3 is a block diagram illustrating a packet including various packet fields for matching against range rules, in accordance with an embodiment of the invention.

FIG. 4 is a table illustrating an access control list including a variety of match against range rules, in accordance with an embodiment of the invention.

DETAILED DESCRIPTION

Figure 1:
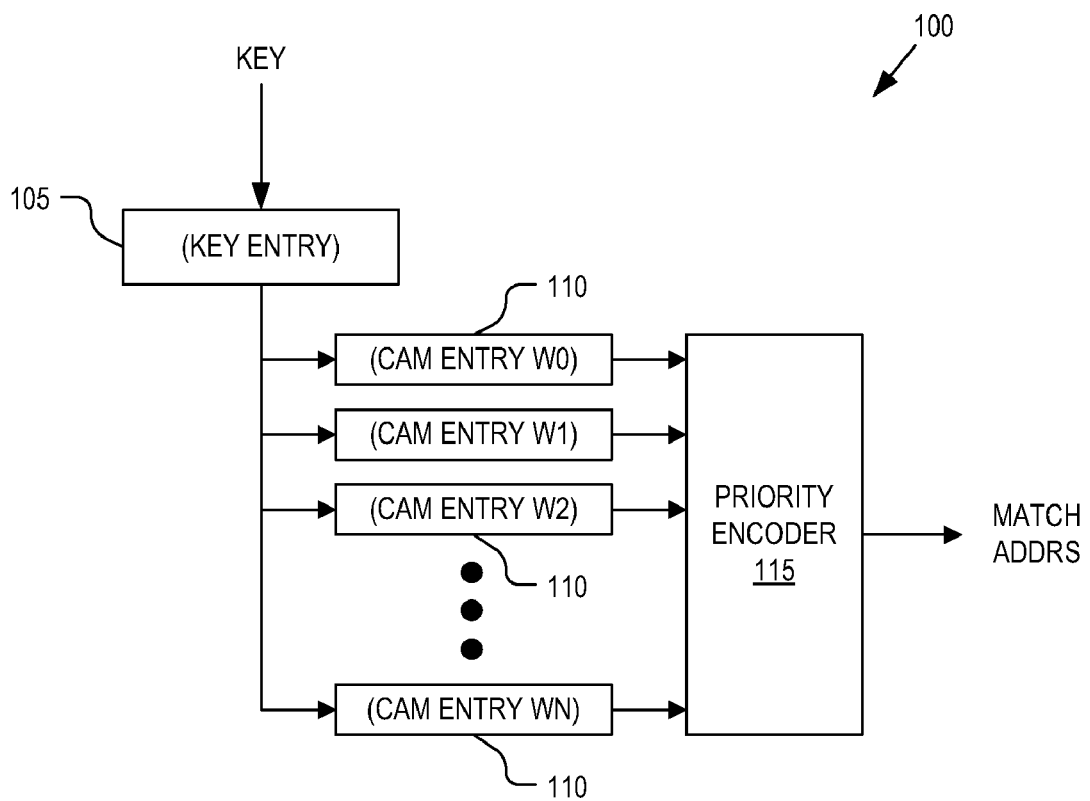
FIG. 1 is a block diagram illustrating a conventional content addressable memory ("CAM") array.

Embodiments of an apparatus and method for implementing range matching using a reduced number of rule entries stored in content addressable memory ("CAM") are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

FIG. 2 is a table 200 illustrating range rule descriptions for use with an access control list ("ACL"), in accordance with an embodiment of the invention. FIG. 2 illustrates three rules with associated descriptions; however, it should be appreciated that table 200 may include any number of rules, perhaps even tens of thousands of rules. Furthermore, embodiments of the invention are not limited for use with ACLs, but may be used in a variety of network applications, network search engine ("NSE") applications, data imagery applications, and the like.

An ACL is a set of rules associated with a file, directory, or other network resource that define the permissions that users, groups, processes, or devices have for accessing the particular resource. For example, rule #1 of table 200 is a rule that states, DENY all traffic access to the particular resource (e.g., file, directory, network communication channel, etc.) originating from source IP addresses 66.77.*, where "*" represents a wild card. Therefore, all network traffic with the most significant bits ("MSBs") matching 66.77 will be denied access. Rule #2 states, ALLOW only hypertext transport protocol ("HTTP") traffic heading for destination IP address 15.24.* access to network resources. Since HTTP traffic corresponds to traffic with a transport control protocol ("TCP") destination port 80, at a lower level, rule #2 states ALLOW all traffic with a destination IP address 15.24.* and having a TCP destination port equal to 80. Rule #3 states DENY user datagram protocol ("UDP") traffic to destination ports less than or equal to 255.

Rules #1-3 are all range type rules. Rules #1 and #2 are maskable ranges, which allow the least significant bits ("LSBs") to be masked while the MSBs are exactly matched. Rule #3 requires actual inspection of the destination port range to determine whether or not it is less than or equal to 255.

FIG. 3 is a block diagram illustrating a packet 300 including various packet fields for matching against range rules, in accordance with an embodiment of the invention. The illustrated embodiment of packet 300 includes a source IP address field 305, a destination IP address field 310, a source port field 315, a destination port field 320, a proto ID field 325, a payload field 330, and a footer field 335. The packet fields including source IP address 305, destination IP address 310, source port 315, destination port 320, and proto ID 325 together are often referred to as the header field of packet 300. It should be appreciated that packet 300 may include other packet fields not illustrated or may omit some fields illustrated and may even be arranged in a different order than illustrated.

Source IP address field 305 and destination IP address field 310 contain the source IP address and destination IP address, respectively, of the particular packet 300. Source port field 315 may contain a machine specific port number to which any response should be sent. Destination port field 320 may contain an application specific protocol identifier, such as file transfer protocol ("FTP") identifier, an HTTP identifier, and the like. Proto ID field 325 may contain various protocol identifiers, such as TCP, UDP, L4 protocol, and the like. Payload field 330 contains the actual data to be transmitted, while footer field 335 may contain error verification data, such as cyclical redundancy checking ("CRC") bits.

The various packet fields of packet 300 may be parsed by a network processing unit ("NPU"), an NSE, or other processing entity as packet 300 propagates through a network or computer. This parsing may be executed for the purpose of categorizing, determining access permissions to resources, and/or whether to take other actions based on characteristics of packet 300. The parsed packet fields may be compared against the rules illustrated in table 200 to determine what action, if any, should be taken on a particular packet 300. Accordingly, in the case of rule #1, source IP address field 305 would be parsed and the MSBs compared while the LSBs are masked off. In some embodiments, all fields of packet 300 may be parsed and the packet fields of interest, or portions thereof, compared while the remaining packet fields are masked off as "don't cares."

Parsing packet 300 and comparing the contents thereof against rules #1-3 illustrated in table 200 implements a sort of Match Against Range Rule ("MARR") functionality also referred to as "range matching." MARR may entail receiving an incoming packet 300, parsing the received packet 300, and using the parsed packet fields as a sort of "key" to match against a list or database of range rules. If a "hit" or "match" is determined between the key and the database of range rules, then the actions associated with the one or more matching range rules may be executed.

FIG. 4 is a table illustrating an example ACL 400 including the example range rules described above in connection with table 200. The illustrated embodiment of ACL 400 includes a rule number indexed to an action and to rule entries 405 and mask entries 410 (only a portion of which are labeled) for comparing with packet fields of packet 300. ACL 400 is illustrated using hexadecimal numbers for convenience, but it should be understood that in practice ACL 400 may be implemented using binary numbers.

A '0' listed in mask entries 410 indicates that the corresponding bit positions in rule entries 405 are masked and therefore represent "don't care" bit positions. The masked bit positions, delineated as such by mask entries 410, are represented as an 'X' in the corresponding bit positions of rule entries 405. An 'F' listed in mask entries 410 indicates that the corresponding bit positions in rule entries 405 are not masked or unmasked, and therefore the actual values are listed in the corresponding positions of rule entries 405.

Figure 5:
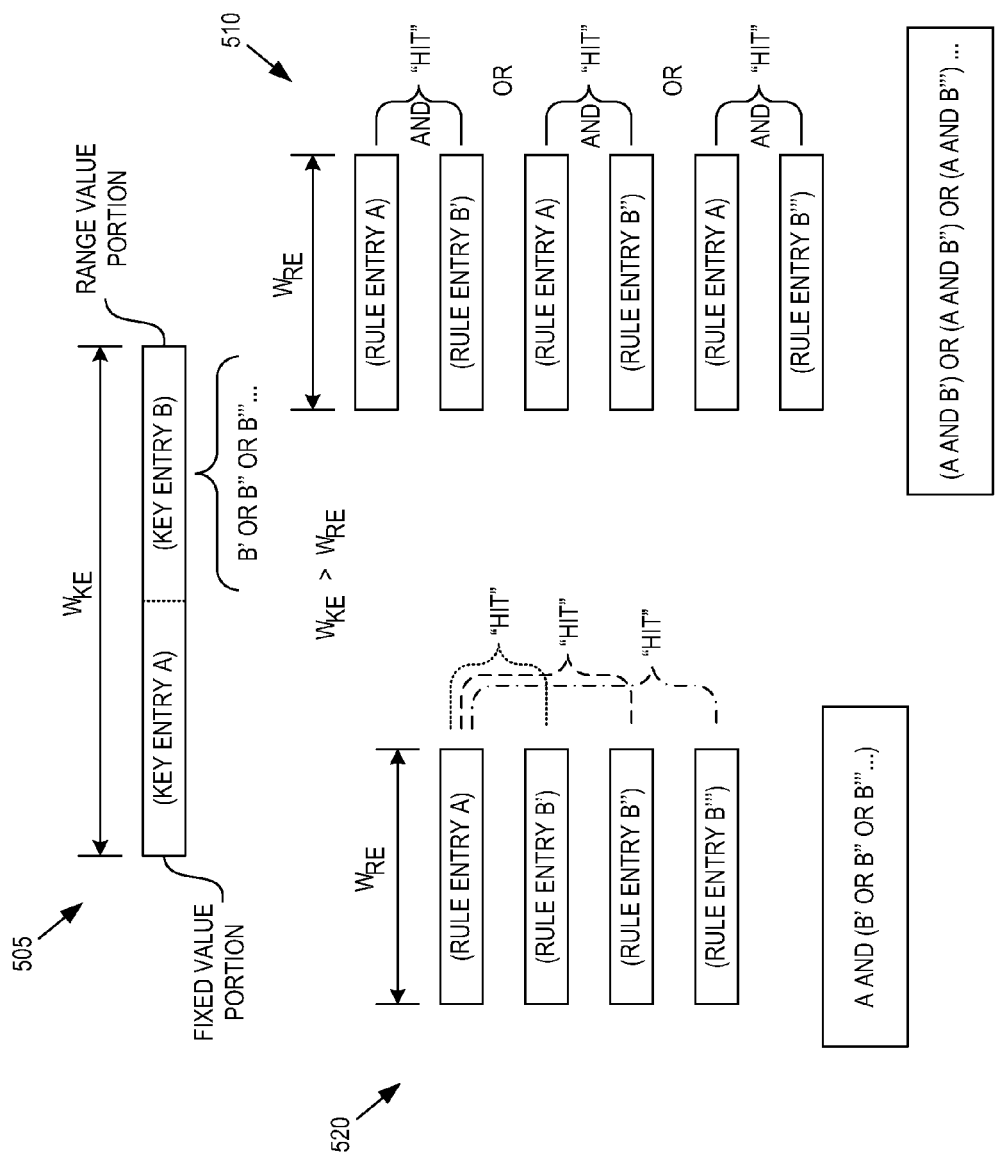
FIG. 5 is a block diagram illustrating how embodiments of an invention reduce the number of rule entries used to implement a logical function compared with conventional approaches.

FIG. 5 is a block diagram illustrating how embodiments of the invention reduce the number of rule entries 405 used to implement a logical function compared with conventional approaches for implementing an equivalent logical function. During operation of ACLs, other networking functions, or otherwise, it is often desirable to store CAM entries (i.e., rule entries stored in a CAM array) within CAM cells of a CAM array to search for key entries having a fixed value portion and a range value portion. For example, a CAM array may be used to search for incoming packets having a fixed source IP address, but having a range of values for the destination port field.

FIG. 5 illustrates a key entry 505 including a fixed value portion A and a range value portion B. Portion B may have a range of values B', B'', B''' ... $B^N$, any of which may result in a "hit" or match. Logically, searching for key entries having a fixed value portion and a range value portion, may be represented by the following logical function, (A AND B') OR (A AND B'') OR (A AND B''') ..., (Function 1)

which is logically equivalent to,

A AND (B' OR B'' OR B''' OR ... $B^N$), (Function 2)

wherein A represent a comparison result on portion A with a rule entry and B', B'', B''', and $B^N$ each represent comparison results on possible values for portion B with a corresponding rule entry. The CAM array should generate a match indication if (A and B'), else if (A and B''), else if (A and B''), else if (A and $B^N$) is found to be true. As described below, embodiments of the invention include CAM arrays capable of implementing functions 2 using a reduced number of rule entries or CAM entries and therefore the number of comparisons needed to represent the match rule are reduced. Since, only rule entries B', B'', B''' ... $B^N$ are expanded into multiple CAM entries, while rule entry A occupies a single CAM entry, the techniques described herein are referred to as Partial Row Expansion By ORing ("PREBOR").

Array 510 illustrates how conventional CAM arrays represent function 1. A copy of rule entry A is stored in a CAM cell for each alternative value of portion B. Accordingly, the conventional approach requires 2·N (where N represents the number of alternative values for portion B) rule entries occupying 2·N CAM entries within array 510 to implement function 1. In the illustrated embodiment, portion B includes three alternative values (B', B", and B'"), requiring six rule entries for the conventional approach. In contrast, array 520 illustrates how embodiments of the invention implement function 2, which is logically equivalent to function 1, but only uses a single instance of rule entry A. Therefore, array 520 is capable of implementing function 1 with N+1 rule entries occupying N+1 CAM entries.

Figure 6:
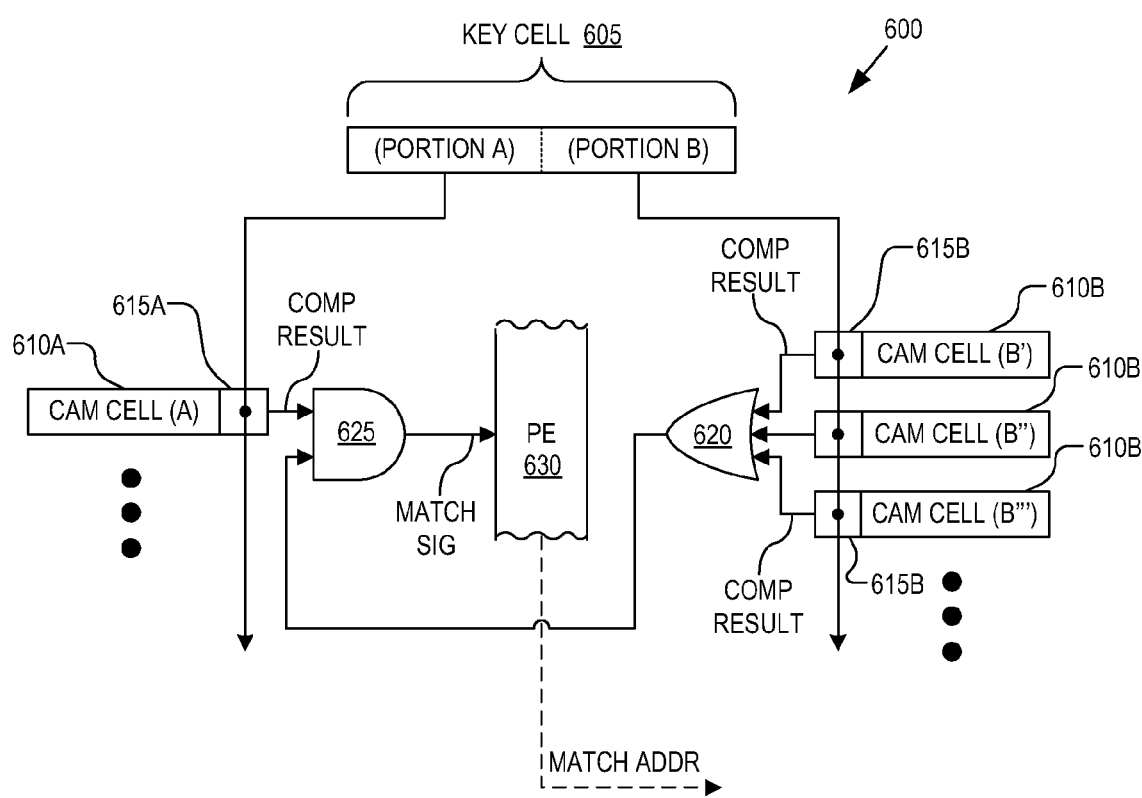
FIG. 6 is a schematic diagram illustrating a portion of a content addressable memory ("CAM") array modified to efficiently implement a range matching, in accordance with an embodiment of the invention.

FIG. 6 is a schematic diagram illustrating a portion of a CAM array 600 modified to efficiently implement range matching on a key entry having a fixed value portion and a range value portion, in accordance with an embodiment of the invention. The illustrated portion of CAM array 600 includes a key cell 605, CAM cells 610A and 610B (collectively 610), comparators 615A and 615B (collectively 615), an ORing circuitry 620, ANDing circuitry 625 and a priority encoder 630.

In one embodiment, CAM cells 610 are binary CAM cells for performing exact matches between the contents or CAM entries of each CAM cell and the contents or key entry of key cell 605. In one embodiment, CAM cells 610 are ternary CAM ("TCAM") cells for performing ternary matches between the CAM entries of each CAM cell 610 and the key entry. A ternary match is defined herein as a binary exact match that may include maskable bit positions as "don't cares." In other embodiments, CAM array 600 may include both binary CAM cells and TCAM cells.

In the illustrated embodiment, ORing circuitry 620 is represented as a logical OR gate; however, it is appreciated that other circuit components may implement the logical ORing functionality of ORing circuitry 620. Similarly, ANDing circuit 625 is illustrated as a logical AND gate, but again this circuit element may be substituted for other circuit elements capable of implementing a logical ANDing function. For example, both ORing circuitry 620 and ANDing circuitry 625 may be implemented within other logic/circuit elements, not illustrated, and therefore not exist as discrete, isolated circuit blocks. In one embodiment, comparators 615 are implemented with match sense amplifiers. In one embodiment, key cell 605 and CAM cells 610 are implemented with multi-bit hardware registers; however, other components may be substituted including multi-bit memory cells, multi-bit buffers, multi-bit latches, random access memory ("RAM"), and the like.

The illustrated components of CAM array 600 interoperate as follows. CAM cells 610 each store a rule entry or CAM entry (e.g., rule entry 405) and key cell 605 stores a key entry having a portion A and a portion B. In the illustrated embodiment, CAM cell 610A stores a CAM entry (a.k.a. rule entry) having a bit width $W_{RE(A)}$ equal to a bit width $W_{KE(A)}$ of portion A of the key entry. Similarly, CAM cells 610B store CAM entires having bit widths $W_{RE(B)}$ equal to a bit width $W_{KE(B)}$ of portion B of the key entry. If CAM cell 610 are TCAM cells, then the TCAM cells can mask bit positions of their respective CAM entries to perform ternary matches (e.g., per mask entries 410). In the TCAM cell embodiment, CAM cells 610 may be capable of storing CAM entries of variable length, since unused bit locations are maskable.

Comparator 615A is coupled to compare the CAM entry of CAM cell 610A with the fixed value portion A of the key entry stored in key cell 605. Similarly, comparators 615B are coupled to compare the CAM entries of CAM cells 610B with the range value portion B of the key entry stored in key cell 605. If a CAM entry of a CAM cell 610 matches its corresponding portion of the key entry, then the corresponding comparator 615 will assert a comparison result signal indicating the match.

ORing circuitry 620 is coupled to logical OR the comparison results from comparators 615B. Anding circuitry 625 is coupled to logically AND the comparison result from comparator 615A with the result of ORing circuitry 620. Accordingly, if the CAM entry stored in CAM cell 610A matches portion A of the key entry and any of the CAM entries stored in CAM cells 610B matches portion B of the key entry, then ANDing circuitry 625 generates a match signal. Priority encoder 630 is coupled to receive the match signal and generates a match address signal in response, indicating the "hit" and which rule entry stored in CAM array 600 was a match.

It should be appreciated that FIG. 6 illustrates only a portion of CAM array 600. CAM array 600 may include several groups of CAM cells 610A and CAM cells 610B, each group having the same or different number of CAM cells 610B logically ORed together. In one embodiment, ORing circuitry 620 may be selectively enabled and furthermore coupled to logically OR a selective number of CAM cells 610B.

Figure 7:
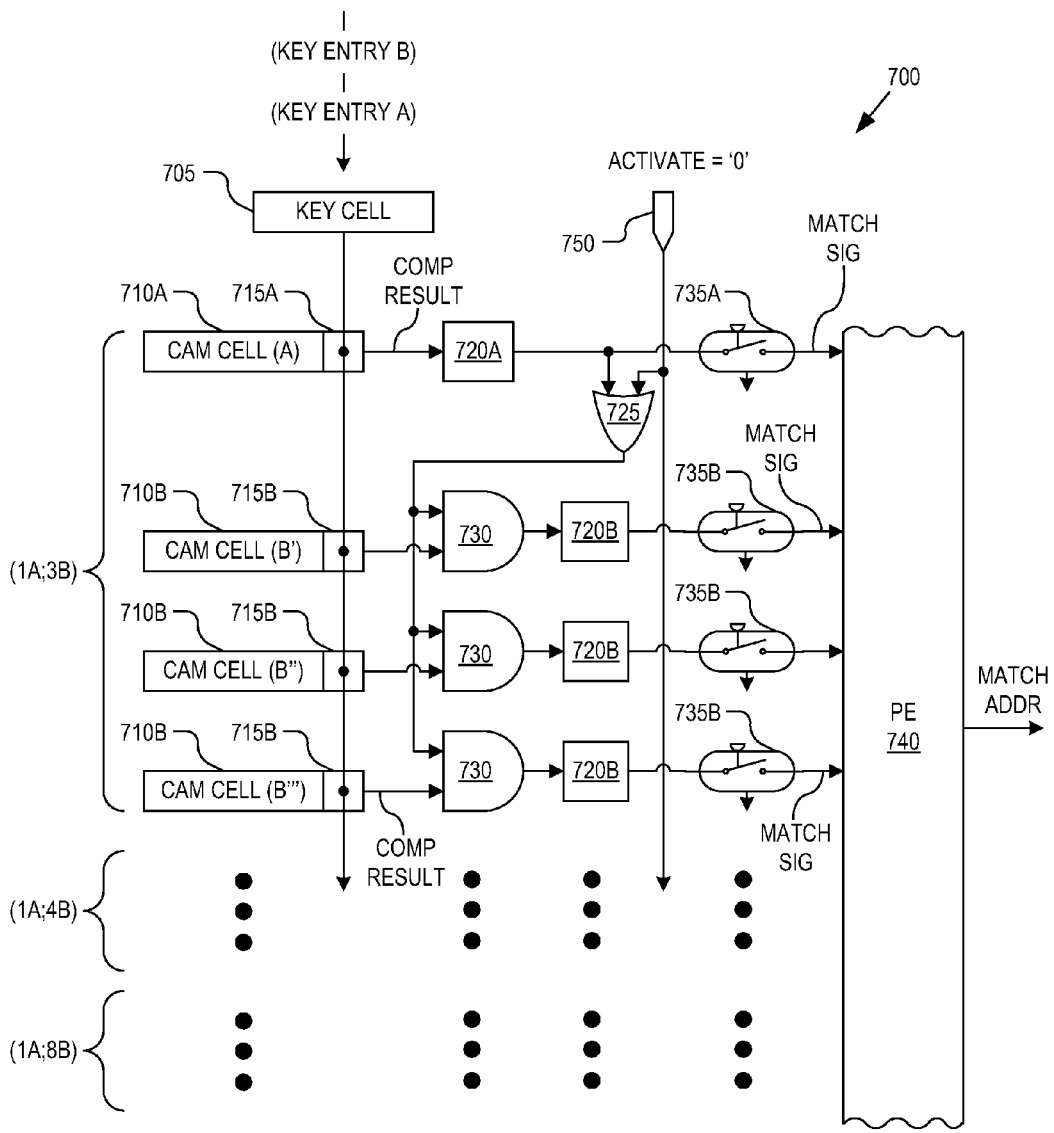
FIG. 7 is a schematic diagram illustrating a portion of a CAM array modified to efficiently implement a range matching, in accordance with an embodiment of the invention.

FIG. 7 is a schematic diagram illustrating a portion of a CAM array 700 modified to efficiently implement range matching on a key entry having a fixed value portion and a range value portion, in accordance with an embodiment of the invention. The illustrated portion of CAM array 700 includes a key cell 705, CAM cells 710A and 710B (collectively 710), comparators 715A and 715B (collectively 715), registers 720A and 720B, ORing circuitry 725, ANDing circuitry 730, suppression circuitry 735A and 735B, and a priority encoder 740.

As with CAM array 600, CAM array 700 may include binary CAM cells and/or TCAM cells for performing either binary exact matching or ternary matching. While the components of CAM array 700 are illustrated as distinct elements (e.g., registers 720, ORing circuitry 725, ANDing circuitry 730, suppression circuitry 735), it should be appreciated that these elements may be implemented in a variety of different manners and combined or integrated with other functional elements, not illustrated. In one embodiment, key cell 705, CAM cells 710, and registers 720 are implemented with multi-bit hardware registers; however, other components may be substituted including multi-bit memory cells, multi-bit buffers, multi-bit latches, random access memory ("RAM"), and the like.

In one embodiment, key cell 705 has the same bit width as each of CAM cells 710. Accordingly, CAM array 700 performs range matching on key entries having fixed and range value portions over multiple clock cycles. In one clock cycle with portion A of the key entry registered in key cell 705, a comparison is executed between portion A of key cell 705 and CAM cells 710. The comparison result between key cell 705 and CAM cell 710A is then registered in register 720A. During this first comparison, suppression logic 735 may be enabled to suppress the comparison results from generating a match signal to priority encoder 740.

After the first comparison, portion B of the key entry is stored into key cell 705. The CAM array 700 then performs a second comparison between the contents of key cell 705 and CAM cells 710. The comparison results generated by comparators 715B are logically ANDed by ANDing circuitry 730 with the first comparison result registered in register 720A. The results of ANDing circuitry 730 are then registered into registers 720B. In connection with the second comparison, suppression circuitry 735B is disabled allowing the registered results to propagated through to priority encoder 740. During this second comparison, suppression circuitry 735A is enabled to prevent a match signal from propagating to priority encoder 740 along the first row. If both the first comparison result is a match and one of the second comparison results is a match, then one of registers 720B propagates a match signal through to priority encoder 740 indicating the "hit." Priority encoder 704 then generates a match address signal indicating which CAM entries generated the "hit."

During the range matching operation discussed above, an activate signal 750 is asserted low '0' to ORing circuitry 725. When register 720A registers a logic '1', then a logic '1' propagates through to ANDing circuitry 730. However, CAM array 700 may be selectively configured to operate in a regular mode, where each row or CAM cell 710 operates independently of the other. When activate signal 750 is asserted high '1' to ORing circuitry 725, ANDing circuitry 730 always passes the comparison result from comparators 715B through to registers 720B without logically ANDing the comparison results with the contents of register 720A. Activate signal 750 along with ORing circuitry 730 collectively operate as enable circuitry to selectively enable logically ANDing the first comparison result of register 720A with each of the multiple second comparison results from comparators 715B of CAM cells 710B.

FIG. 7 only illustrates a portion of CAM array 700 having one CAM cell 710A and three CAM cells 710B. CAM cell 710A stores a CAM entry to match against the fixed value portion A of the key entry and CAM cells 710B store CAM entries to match against the range value portion B of the key entry. However, the illustrated portion may be replicated many times within CAM array 700 with each group instance having the same or different number of CAM cells 710B. For example, CAM array 700 may include a group instance having 1A and 3B rows (illustrated), 1A and 4B rows, 1A and 8B rows, etc.

CAM arrays 600 and 700 enable range matching on large key entries using segmented rule entries (or CAM entries) stored in smaller CAM cells. CAM arrays 600 and 700 enable performing range matching on a 320 bit key entry using only 160 bit CAM cells. CAM arrays 600 and 700 are wells suited for performing ACL functionality on Internet Protocol Version 6 ("IPv6") packets.

Figure 8:
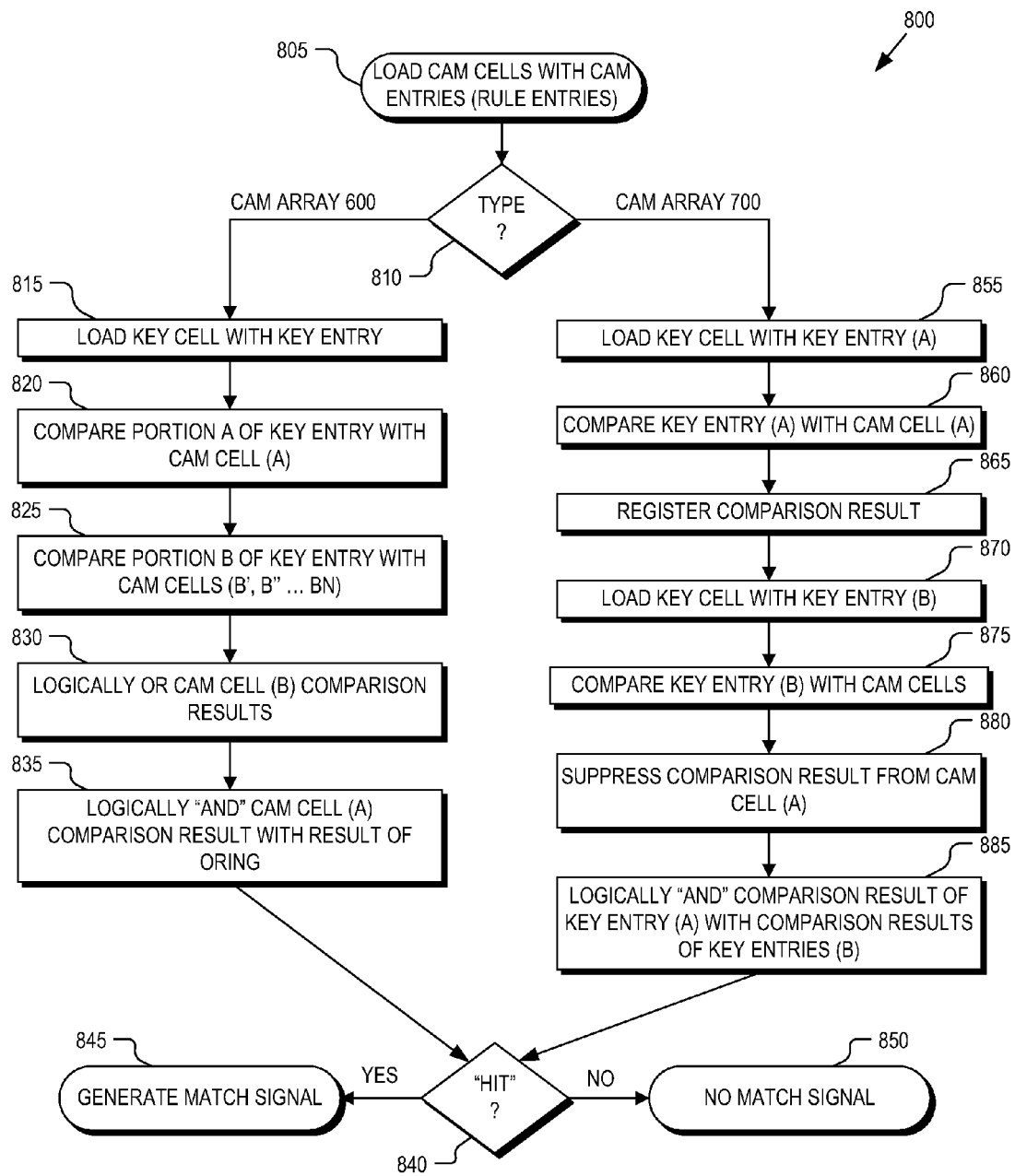
FIG. 8 is a flow chart illustrating a process for implementing range matching using a reduced number of rule entries of CAM, in accordance with an embodiment of the invention.

FIG. 8 is a flow chart illustrating a process 800 for implementing range matching using a reduced number of rule entries, in accordance with an embodiment of the invention. The process explained below is described in terms of computer software and hardware. The techniques described may constitute machine-executable instructions embodied within a machine (e.g., computer) readable medium, that when executed by a machine will cause the machine to perform the operations described. Additionally, the processes may be embodied within hardware, such as an application specific integrated circuit ("ASIC") or the like. The order in which some or all of the process blocks appear in each process should not be deemed limiting. Rather, one of ordinary skill in the art having the benefit of the present disclosure will understand that some of the process blocks may be executed in a variety of orders not illustrated.

In a process block 805, CAM cells are loaded with CAM entries. The CAM entries represent rule entries (e.g., rule entries 405) for matching against key entries. If CAM array 600 is operating (decision block 810), then the key cell is loaded with a key entry including both a fixed value portion A and a range value portion B (process block 815). In a process block 820, portion A of the key entry is compared against the CAM entry within CAM cell (A). In a process block 825, portion B of the key entry is compared against the CAM entry within CAM cells (B) (e.g, B', B'', B''', ... $B^N$). It should be appreciated that process block 820 and 825 may occur simultaneously. The comparison results from CAM cells (B) are logically ORed together (process block 830) and the result of the ORing logically ANDed with the comparison result from CAM cell (A) (process block 835). If a match occurs between the CAM entry in CAM cell (A) and portion A of the key entry and between any of the CAM entries in CAM cells (B) and portion B of the key entry (decision block 840), then a match signal is generated (process block 845). If a match does not occur at either CAM cell (A) or all of CAM cells (B) (decision block 840), then no match signal is generated (process block 850).

Returning to decision block 810, if CAM array 700 is operating, then the key cell is loaded with portion A of the key entry (process block 855). In a process block 860, portion A of the key entry is compared against the CAM entry within CAM cell (A). In a process block 865, the comparison result from CAM cell (A) is registered. In a process block 870, portion B of the key entry is loaded into the key cell. Once loaded, portion B is compared against the CAM entries (process block 875). During the comparison, CAM cell (A) is suppressed by the suppression circuitry (process block 880) to prevent an accidental hit occurring at CAM cell (A) if the first and second portions of the key entry are similar. In a process block 885, the registered comparison result from CAM cell (A) is logically ANDed with the comparison result from each of the CAM cells (B). As described above, if a "hit" occurs, then a match signal is generated (process block 845) else no match signal is generated (process block 850).

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A method, comprising:
  comparing a first content addressable memory ("CAM") entry with a first key value to generate a first comparison result;
  comparing each of multiple second CAM entries with a second key value to generate multiple second comparison results; and
  generating a match signal if the first key value matches the first CAM entry and the second key value matches at least one of the multiple second CAM entries; wherein the first and second CAM entries store a network processing rule.

2. The method of claim 1, wherein the match signal is generated by determining a logical relation within the array of CAM cells given by:

$$A \text{ and } (B' \text{ or } B'' \text{ or } \ldots B^N),$$

wherein A represent the first comparison result, B' represents a first one of the multiple second comparison results, B'' represents a second one of the multiple second comparison results, and $B^N$ an Nth one of the multiple second comparison results.

3. The method of claim 1, wherein the first and second key values comprise first and second portions of a single key entry.

4. The method of claim 3, wherein comparing the first CAM entry and comparing each of the multiple second CAM entries are executed in parallel with one another.

5. The method of claim 4, wherein generating the match signal if the first key entry matches the first CAM entry and the second key entry matches at least one of the multiple second CAM entries comprises:
   logically combining the multiple second comparison results to generate a combined result; and
   logically combining the combined result with the first comparison result.

6. The method of claim 1, further comprising:
   loading the first key value into a key entry prior to comparing the first CAM entry with the first key value; and
   loading the second key value into the key entry prior to comparing the multiple second CAM entries with the second key value, wherein comparing the first CAM entry and comparing the multiple second CAM entries are executed during different time periods.

7. The method of claim 1, wherein generating the match signal if the first key value matches the first CAM entry and the second key value matches one of the multiple second CAM entries comprises:
   storing the first comparison result; and
   logically combining the stored first comparison result with each of the multiple second comparison results.

8. The method of claim 7, further comprising:
   suppressing the stored comparison result from a priority encoder coupled to the array of CAM cells while comparing each of multiple second CAM entries with the second key value.

9. The method of claim 1, wherein the array of CAM cells comprises an array of ternary CAM cells capable of performing ternary matches.

10. The method of claim 1, wherein:
    the first key value comprises a first portion of a packet data and the second key value comprises a second portion of a packet data,
    the first CAM entry comprises a fixed portion of a network processing rule having a single value for comparing against the first portion of the packet data, and
    the multiple second CAM entries comprise a range portion of the network processing rule.

11. A method, comprising:
    storing a fixed portion of a network processing rule in a first content addressable memory (CAM) entry; and
    storing a second range portion of the network processing rule as a plurality of second values in corresponding second CAM entries; wherein
    each CAM entry generates a separate match result, and the match results of the second CAM entries are logically combinable with the match result of the first CAM entry.

12. The method of claim 11, wherein:
    the network processing rule comprises a packet processing rule.

13. The method of claim 12, wherein:
    the second range portion comprises at least a destination address of a packet.

14. The method of claim 11, further including
    generating a match signal if a first key value matches the fixed portion and a second key value matches any one of the second values.

15. The method of claim 14, wherein:
    generating the match signal includes applying the first key value to the first CAM entry substantially in parallel with the application of the second key value to the second CAM entries.

16. The method of claim 14, wherein:
    generating the match signal includes
    applying the first key value to the first CAM entry in a first time period, and
    applying the second key value to the second CAM entries in a second time period.

17. A method, comprising:
    in a range compare mode,
    storing a range portion of a network processing rule as a plurality of second key values in corresponding second content addressable memory (CAM) entries, and
    generating a match indication if a first key entry matches a first value stored in a first CAM entry, and a second key entry matches any of the second key values stored in the second CAM entries; and
    in a regular mode, generating a match indication if a key entry matches values stored in any of the first and second CAM entries.

18. The method of claim 17, wherein:
    the first CAM entry and second CAM entries each generate a corresponding match result; and
    in the range compare mode, a match result from the first CAM entry is logically combined with match results of the second CAM entries to generate the match indication.

19. The method of claim 17, wherein:
    the first CAM entry and second CAM entries each generate a corresponding match result; and
    in the range compare mode, the match result from the first CAM entry is suppressed.

20. The method of claim 17, wherein:
    the first CAM entry and second CAM entries each generate a corresponding match result;
    in the range compare mode, the match result from the first CAM entry is prevented from being applied to a priority encoder, and the match results from the second CAM entries are applied to the priority encoder; and
    in the regular mode, the match result from the first and second CAM entries are applied to the priority encoder.

* * * * *